United States Patent
La Rosa et al.

(10) Patent No.: US 9,368,215 B2
(45) Date of Patent: Jun. 14, 2016

(54) METHOD FOR BIASING AN EMBEDDED SOURCE PLANE OF A NON-VOLATILE MEMORY HAVING VERTICAL SELECT GATES

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/810,283

(22) Filed: Jul. 27, 2015

(65) Prior Publication Data

US 2016/0071598 A1   Mar. 10, 2016

(30) Foreign Application Priority Data

Sep. 9, 2014  (FR) .................................... 14 58431

(51) Int. Cl.
| | |
|---|---|
| G11C 11/34 | (2006.01) |
| G11C 16/04 | (2006.01) |
| G11C 16/10 | (2006.01) |
| G11C 16/26 | (2006.01) |
| G11C 16/24 | (2006.01) |

(52) U.S. Cl.
CPC ............ *G11C 16/10* (2013.01); *G11C 16/0408* (2013.01); *G11C 16/0425* (2013.01); *G11C 16/0433* (2013.01); *G11C 16/24* (2013.01); *G11C 16/26* (2013.01)

(58) Field of Classification Search
CPC ........ G11C 16/10; G11C 16/26; G11C 16/24; G11C 16/0408; G11C 16/0425; G11C 16/0433

USPC ......................................... 365/185, 5, 185.17
See application file for complete search history.

(56) References Cited

U.S. PATENT DOCUMENTS

| | | | |
|---|---|---|---|
| 5,182,725 A | 1/1993 | Andoh et al. | |
| 2004/0080982 A1 | 4/2004 | Roizin | |
| 2004/0130947 A1 | 7/2004 | Fan et al. | |
| 2007/0127292 A1* | 6/2007 | Sakui ...................... | G11C 16/10 365/185.17 |
| 2008/0165582 A1 | 7/2008 | Georgescu et al. | |
| 2009/0180306 A1* | 7/2009 | Terada ................... | G11C 5/063 365/72 |
| 2009/0310411 A1* | 12/2009 | Lee .......................... | G11C 8/12 365/185.11 |
| 2010/0265765 A1 | 10/2010 | Seo et al. | |
| 2011/0096609 A1* | 4/2011 | Lee ..................... | G11C 16/0425 365/185.28 |
| 2012/0063223 A1* | 3/2012 | Lee ..................... | G11C 16/0433 365/185.02 |
| 2013/0182509 A1* | 7/2013 | Lee ..................... | G11C 16/3459 365/185.22 |
| 2013/0228846 A1 | 9/2013 | La Rosa et al. | |
| 2013/0229875 A1 | 9/2013 | La Rosa et al. | |
| 2013/0241596 A1* | 9/2013 | Matsumoto ........ | H03K 19/1776 326/44 |

(Continued)

*Primary Examiner* — Toan Le
(74) *Attorney, Agent, or Firm* — Seed IP Law Group PLLC

(57) ABSTRACT

A method controls a memory that includes twin memory cells formed in a semiconductor substrate. Each memory cell includes a floating-gate transistor including a state control gate, in series with a select transistor that includes a vertical select control gate, common to the twin memory cells, and a source connected to an embedded source line, common to the memory cells. The drains of the floating-gate transistors of the twin memory cells are connected to a same bit line. The method includes controlling a memory cell so as to turn it on to couple the source line to a bit line coupled to the ground, during a step of programming or reading another memory cell.

14 Claims, 10 Drawing Sheets

(56) References Cited

U.S. PATENT DOCUMENTS

| | | |
|---|---|---|
| 2014/0036591 A1 | 1/2014 | Takeshita |
| 2014/0063957 A1 | 3/2014 | Pan et al. |
| 2014/0198571 A1* | 7/2014 | Wu .................... G11C 16/0433 365/185.05 |
| 2015/0269972 A1* | 9/2015 | Tatsumura ............. G11C 7/065 365/72 |
| 2015/0287438 A1* | 10/2015 | Chen ........................ G11C 5/06 365/185.05 |
| 2015/0303208 A1* | 10/2015 | Kim .................. H01L 27/11524 257/300 |

\* cited by examiner

METHOD FOR BIASING AN EMBEDDED SOURCE PLANE OF A NON-VOLATILE MEMORY HAVING VERTICAL SELECT GATES

BACKGROUND

1. Technical Field

The present disclosure relates to electrically erasable and programmable non-volatile memories (EEPROM). The present disclosure relates more particularly to a non-volatile memory, comprising memory cells each comprising a floating-gate transistor and an embedded vertical select transistor gate shared with a so-called "twin" adjacent memory cell.

2. Description of the Related Art

FIG. 1 is a wiring diagram of memory cells C11, C12 of the above-mentioned type, belonging to two adjacent pages Pi, Pi+1 of a memory array. The memory cells C11, C12 are read- and write-accessible through a bit line BL, a word line WL<i, i+1> and control gate lines CGL<i>, CGL<i+1>. Each memory cell comprises a floating-gate transistor FGT. The control gate CG of the transistor FGT of the cell C11 is connected to the control gate line CGL<i> through a contact C4. The control gate CG of the transistor FGT of the cell C12 is connected to the control gate line CGL<i+1> through a contact C4. The drain regions of the transistors FGT are connected to a bit line BL through contacts C1. Furthermore, each floating-gate transistor FGT has its source terminal coupled to a source line SL through a respective select transistor ST. The select transistors ST share a same select control gate SGC. The two memory cells C11, C12 are referred to as "twins" due to the fact that they share the same select control gate SGC and the same bit line BL. The common control gate SGC is a vertical gate embedded in a substrate accommodating the memory array, and is in contact with the source line SL formed by a region doped deep down in the substrate. The gate SGC is connected to a word line WL<i,i+1> common to the two memory cells through a contact C3. The channel regions CH1, CH2 of the transistors FGT, ST are at the electric potential of the well PW, as represented by dotted lines. Finally, the source line SL can be connected through a contact C5 to a main source line produced in a level of metal.

FIG. 2 is a schematic cross-section of two twin memory cells C11, C12, comprising a vertical select transistor gate SGC, common to the two memory cells. The memory cells C11, C12 are produced on a P-type conductivity substrate PW. The substrate is formed in a semiconductor wafer WF. The well PW is isolated from the rest of the wafer WF by an N-doped isolation layer n0 surrounding the entire well. Each memory cell C11, C12 comprises a floating-gate transistor FGT and a select transistor ST. Each floating-gate transistor FGT comprises a drain region n1, a source region n2, a floating gate FG, a state control gate CG, and a channel region CH1 extending beneath the floating gate FG between the drain n1 and source n2 regions. The vertical select gate SGC is embedded in the substrate PW and isolated from the latter by an insulating layer D3, for example made of oxide $SiO_2$, forming the gate oxide of the select transistors ST. The region n2 extends along an upper edge of the embedded vertical gate SGC. The gate SGC reaches a source region n0 common to the select transistors ST, which thus forms a source line SL of the select transistors ST. Each select transistor ST thus comprises a drain region common to the source region n2 of the floating-gate transistor FGT of its cell, the common source region n0, and a channel region CH2 extending vertically along the gate SGC between the drain n2 and source n0 regions.

The regions n1, n2 are generally formed by N-doping of the substrate PW. The floating gates FG are generally made of level-1 polycrystalline silicon, or "poly1", and are formed on a tunnel oxide layer D1 formed on the substrate PW. The state control gates CG are generally made of level-2 polycrystalline silicon, or "poly2". Each state control gate CG is formed on one of the floating gates FG previously covered with an oxide layer D2. The gate SGC is formed in a trench filled with level-0 polycrystalline silicon, or "poly0", isolated from the substrate by the oxide layer D3. Depending on the manufacturing method chosen, the conducting trench forming the gate SGC may not have any electrical discontinuity. It may then be used directly as word line WL.

The two memory cells C11, C12 are covered with a dielectric insulating material D0, which may also be oxide $SiO_2$. The drain regions n1 of the floating-gate transistors FGT are coupled to a same bit line BL through a contact C1 passing through the insulating material D0.

FIGS. 3 and 4 represent the wafer WF in a cross-section and in a top view. FIGS. 3 and 4 show the layer n0 which delimits the well PW in the wafer WF. The layer n0 may be formed by two implantations of N-type dopants. A first implantation enables a horizontal layer of doped semiconductor to be formed that delimits the bottom of the well PW. A second implantation enables vertical walls of the well PW to be formed. FIG. 4 also shows the contacts C5 on the upper edge of the walls of the isolation layer n0. As the layer n0 is used as source line, many contacts C5 are preferably provided along the upper edge of the walls of the layer n0, as represented in the figure, so as to reduce its electrical resistance and foster the distribution of current lines in all directions. As indicated above, the contacts C5 enable the layer n0 to be coupled to a main source line SL made in a level of metal, or to control units for controlling the source line voltage.

BRIEF SUMMARY

It transpires that the layer n0 has a considerable resistivity. Thus, FIG. 5 represents a variation curve of the voltage VN of the layer n0 measured along a line passing through the wafer WF, when a current is injected into the center of the well PW, the contacts C5 being grounded. FIG. 5 shows that the voltage VN of the layer n0 increases from the edges of the well PW towards the center of the latter. The resistivity of the layer n0 thus prevents any precise control of the voltage applied to the source line, particularly when programming or reading a memory cell that is among those furthest from the contacts C5.

It is possible to consider forming bias contacts for biasing the layer n0 in a central region of the well PW. However, it is not desirable to form such bias contacts due to the significant surface area they occupy.

It is thus desirable to improve the biasing of the layer n0 without significantly reducing the surface area of wafer that may be used to form memory cells.

Some embodiments relate to a method for controlling a non-volatile memory on a semiconductor substrate, the memory comprising: bit lines, control gate lines, at least one word line, a source line formed deep down in the substrate, and pairs of twin memory cells, each comprising a first memory cell comprising a first floating-gate transistor having a control gate coupled to a first one of the control gate lines, a first conduction terminal coupled to a first one of the bit lines and a second conduction terminal coupled to the source line through a first select transistor having an embedded vertical select control gate, coupled to the word line, and a second memory cell comprising a second floating-gate transistor having a control gate coupled to a second one of the control gate lines, a first conduction terminal coupled to the first bit line and a second conduction terminal coupled to the source line through a second select transistor sharing with the first select transistor the select control gate. According to one embodiment, the method comprises a step of controlling a memory cell of one of the pairs of memory cells, so as to render it on to couple the source line to a line coupled to the ground, during a step of programming or reading another memory cell of the pairs of memory cells.

According to one embodiment, the method comprises a step of programming a memory cell to be programmed of one of the pairs of memory cells, by hot-electron injection, by means of a programming current passing through the memory cell to be programmed, by applying a first positive voltage to the bit line coupled to the memory cell to be programmed and a second positive voltage to the control gate line coupled to the memory cell to be programmed.

According to one embodiment, the method comprises a step of reading a memory cell to be read of a pair of memory cells, consisting of: applying a positive read voltage to the control gate line coupled to the memory cell to be read, and applying a zero voltage to the control gate line coupled to the twin memory cell of the memory cell to be read.

According to one embodiment, a memory cell of one of the pairs of memory cells is dedicated to grounding the source line, the dedicated memory cell being kept on, and the first conduction terminal of the floating-gate transistor of the dedicated memory cell being coupled to the ground.

According to one embodiment, the programmed memory cell and the memory cell rendered on to ground the source line are coupled to a same word line, to a same control gate line and to respective bit lines having respective ranks of different parities among the bit lines of the memory.

Some embodiments also relate to a non-volatile memory on a semiconductor substrate, comprising: bit lines, control gate lines, at least one word line, a source line formed deep down in the substrate, and pairs of twin memory cells, comprising a first memory cell comprising a first floating-gate transistor having a control gate coupled to a first one of the control gate lines, a first conduction terminal coupled to a first one of the bit lines and a second conduction terminal coupled to the source line through a first select transistor having a select control gate coupled to the word line, and a second memory cell comprising a second floating-gate transistor having a control gate coupled to a second one of the control gate lines, a first conduction terminal coupled to the first bit line and a second conduction terminal coupled to the source line through a second select transistor sharing with the first select transistor the select control gate, and means for programming the first memory cell independently of the second memory cell and vice versa. According to one embodiment, the memory is configured to control a memory cell of one of the pairs of memory cells, so as to render it on to couple the source line to a line coupled to the ground, during a step of programming or reading another memory cell of the pairs of memory cells.

According to one embodiment, the memory is configured to program a memory cell to be programmed of one of the pairs of memory cells by hot-electron injection, by means of a programming current passing through the memory cell to be programmed, by applying a first positive voltage to the bit line coupled to the memory cell to be programmed and a second positive voltage to the control gate line coupled to the memory cell to be programmed.

According to one embodiment, the memory is configured to read a memory cell to be read of a pair of memory cells, by applying a positive read voltage to the control gate line coupled to the memory cell to be read, and by applying a zero voltage to the control gate line coupled to the twin memory cell of the memory cell to be read.

According to one embodiment, a memory cell of one of the pairs of memory cells is dedicated to grounding the source line, the dedicated memory cell being kept on, and the first conduction terminal of the floating-gate transistor of the dedicated memory cell being coupled to the ground.

According to one embodiment, each bit line is coupled to the ground through a grounding transistor, the grounding transistors for grounding bit lines of even rank being controlled through a third control gate line and the grounding transistors for grounding bit lines of odd rank being controlled through a fourth control gate line.

According to one embodiment, each grounding transistor is connected to a bit line end section, the bit line end sections at each bit line end being alternately not connected and connected to a bias contact of the source line.

According to one embodiment, the memory comprises main bit lines and several memory array sectors, each sector comprising local bit lines, and each local bit line being coupled to one of the main bit lines through a local bit line select transistor, the local bit line select transistors of each sector being controlled by a common control gate line.

According to one embodiment, the select control gate has two opposite faces along which a vertical channel region for the first select transistor, and a vertical channel region for the second select transistor respectively extend.

According to one embodiment, each pair of memory cells comprises: a first doped region extending along a first upper edge of the embedded gate, forming a drain region of the select transistor and a source region of the floating-gate transistor, of a first memory cell of the pair of memory cells, a second doped region extending along a second upper edge of the embedded gate opposite the first upper edge, forming a drain region of the select transistor and a source region of the floating-gate transistor, of a second memory cell of the pair of memory cells, and a third doped region extending deep down in the substrate, in contact with two opposite lower edges of the embedded gate, and forming a common source region of the select transistors of the memory, each select transistor of the pair of memory cells having a vertical channel region extending on a respective side of the embedded gate, between the first or the second doped region and the third doped region.

BRIEF DESCRIPTION OF THE SEVERAL VIEWS OF THE DRAWINGS

Some examples of embodiments of the present disclosure will be described below in relation with, but not limited to, the accompanying figures, in which.

DETAILED DESCRIPTION

Figure 1:
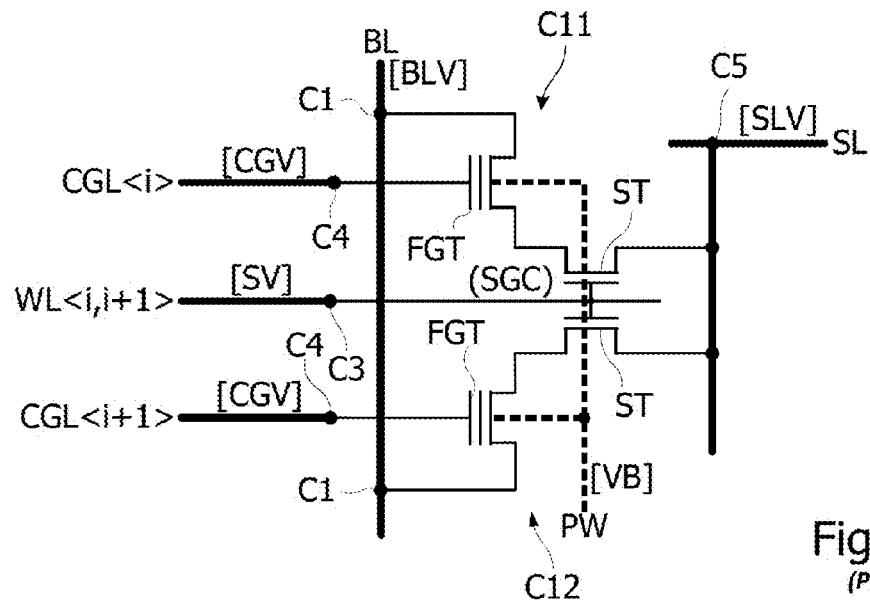
FIG. 1 described above is a wiring diagram of memory cells of an EEPROM memory.
Figure 2:
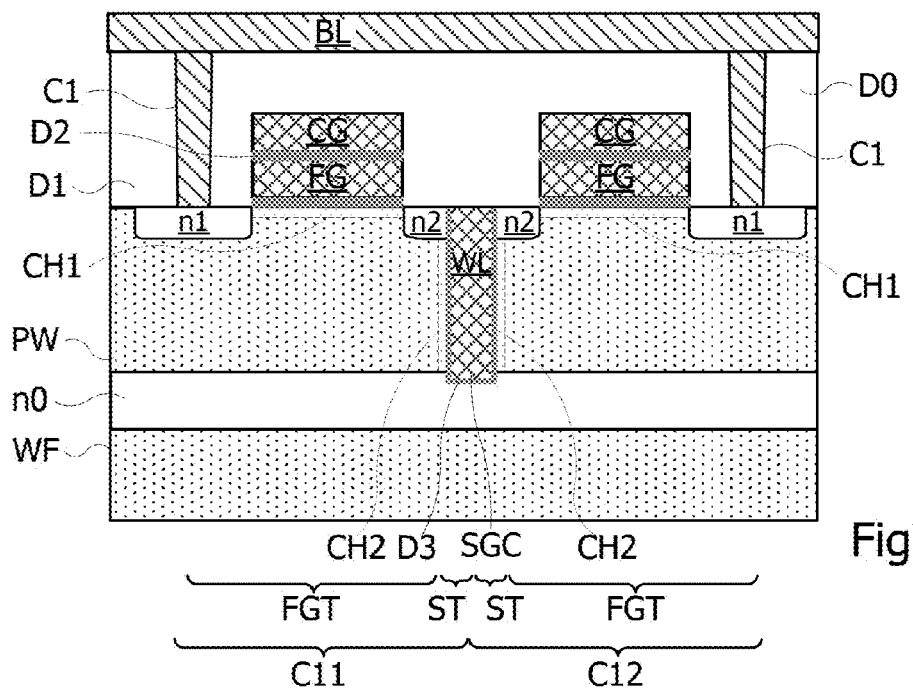
FIG. 2 described above is a schematic cross-section of two memory cells comprising a vertical select gate SGC, common to the two memory cells, FIGS. 3 and 4 previously described represent a cross-section and a top view of a wafer in which the memory cells in FIG. 2 are formed, FIG. 5 described above represents a variation curve of the voltage of a deep isolation layer, measured along a line passing through the wafer represented in FIG. 3 or 4 and passing through a central point of the wafer.
Figure 3:
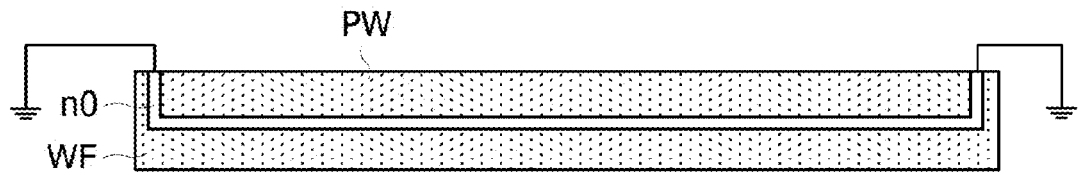
Figure 4:
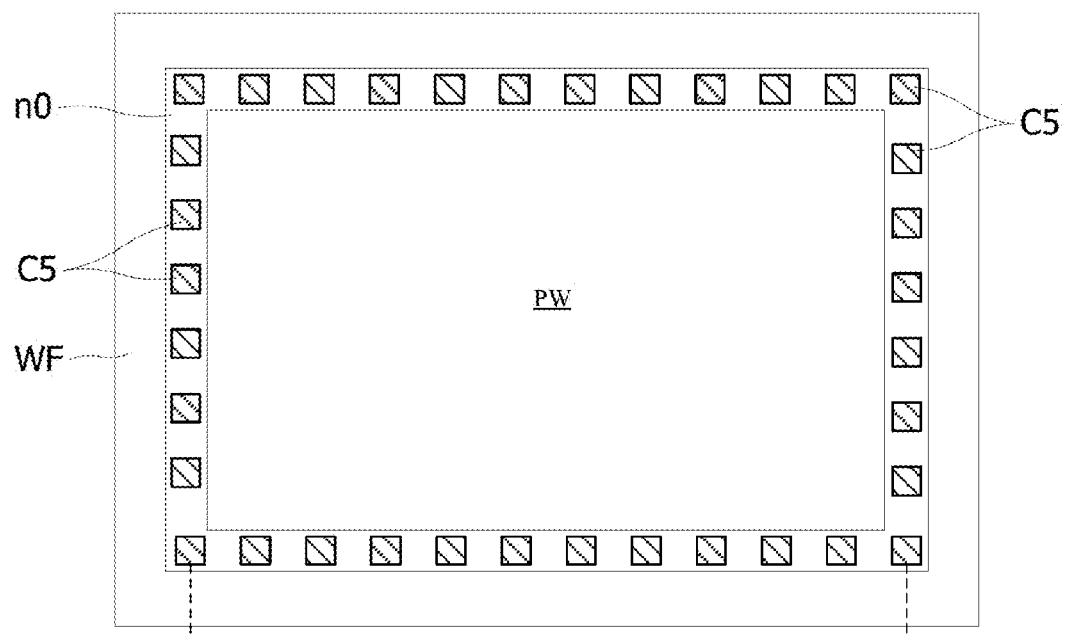
Figure 5:
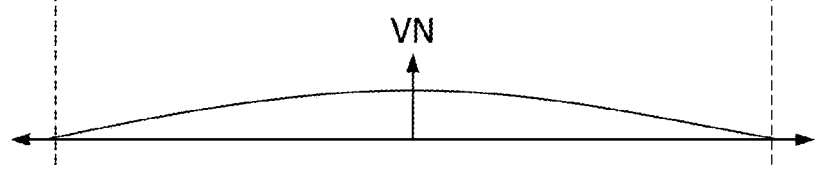
Figure 6:
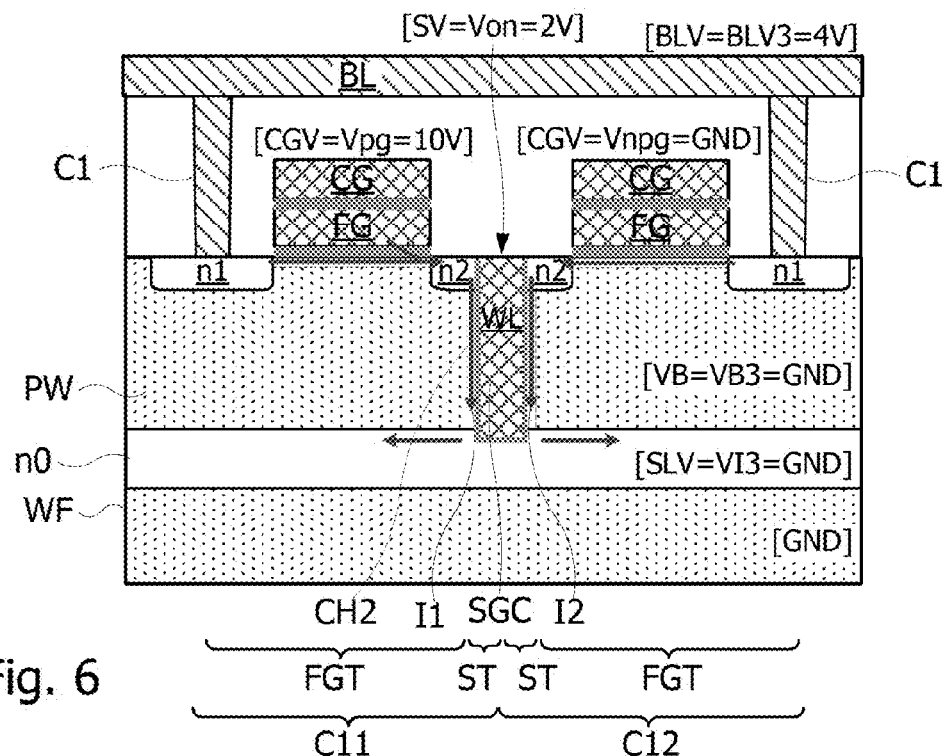
FIG. 6 is a schematic cross-section of the pair of memory cells in FIG. 2, showing a method for programming a memory cell.

FIG. 6 represents the two twin memory cells C11, C12 in FIG. 2 and indicates voltage values applied to the memory cells during an operation of "hot-electron" programming the memory cell C11. During such a programming operation, the two transistors FGT, ST of the memory cell C11 cooperate in order to inject electric charges into the floating gate FG. The select transistor ST has a conducting channel CH2 in which a current I1 (represented by arrows on FIG. 6) forms, comprising high kinetic energy electrons, referred to as "hot electrons". When the current I1 reaches the conducting channel CH1 of the floating-gate transistor FGT, an injection zone forms where certain high energy electrons are injected into the floating gate FG under the effect of a transverse electric field generated by the voltage applied to the control gate CG. The charges are thus transferred from the substrate PW to the floating gate FG (programming) by passing through the select transistor ST of the memory cell C11, and by applying a high difference in potential (for example 10V) to the floating gate FG, sufficient to obtain this charge transfer. It transpires that the intensity of the current I1 varies according to the distance between the memory cell and the closest contact C5 (FIG. 4) for biasing (grounding) the layer n0 forming the common source line. Due to this variation in current intensity, the conditions of programming, and in particular the quantity of electrons injected into the floating gate FG of a programmed memory cell also vary according to the position of the memory cell in the well PW. The result is that certain memory cells that have been programmed may be read as erased.

It can be noted that in the twin cell C12, a current I2 (represented by arrows on FIG. 6) also flows in the channel CH1 of the transistor FGT and in the channel CH2 of the transistor ST of the memory cell C12. The current I2 is not sufficient to program the cell C12 due to the fact that the control gate CG of the transistor FGT12 receives an insufficient voltage (GND) to form an electric field capable of injecting electrons into the floating gate FG of this transistor.

Figure 7:
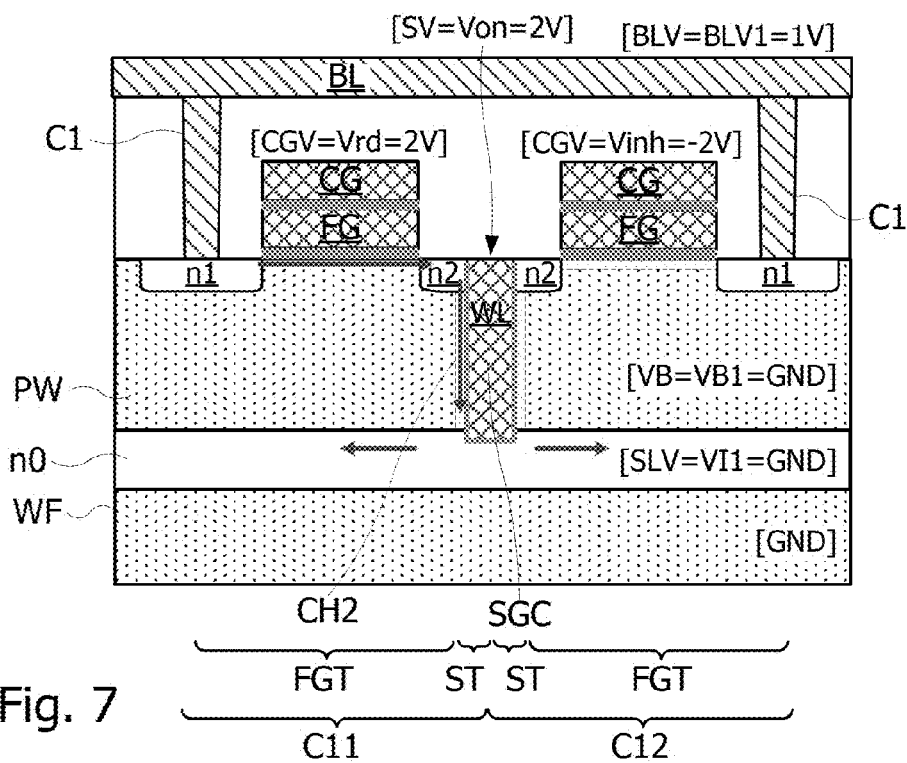
FIG. 7 is a schematic cross-section of the pair of memory cells in FIG. 2, showing a method for reading a memory cell, FIG. 8 schematically represents circuits of a memory array in which the programming and reading methods can be implemented, according to one embodiment, FIG. 9 schematically represents circuits of the memory array in FIG. 8, showing a method for biasing the deep layer, during the programming of memory cells, according to one embodiment.

FIG. 7 represents the two twin memory cells C11, C12 in FIG. 2 and indicates voltage values applied to the memory cells when reading the memory cell C11. Thus, when reading the memory cell C11, the common select gate SGC of the two select transistors ST of the twin memory cells, receives the read-select voltage Von. The select transistors ST are thus on. A current (represented by arrows on FIG. 7) flows in the channel region CH1 of the transistor FGT and in the channel region CH2 of the transistor ST of the memory cell C11. This current is representative of the threshold voltage of the transistor FGT which is itself representative of a programmed or erased state of the transistor, which depends on a quantity of electric charges stored in its floating gate FG. This current is sensed by a sense amplifier not represented in FIG. 7, which supplies a binary datum stored by the memory cell C11. Therefore, the select transistor ST of the twin memory cell C12 is also put to the on state, and its channel CH2 is conducting. If the transistor FGT of the memory cell C12 is in an over-erased state, it may also be on. The result is that the memory cell C11 will be seen on during the reading and thus erased, even though it is off (programmed). To avoid this phenomenon, the voltage CGV applied to the control gate of the transistor FGT of the memory cell C12 can be set to an inhibit voltage Vinh which forces this transistor FGT to the off state and thus prevents it from conducting, even if it is in the over-erased state. This voltage is chosen equal to −2V which is lower than the threshold voltage of the floating-gate transistors in the erased state.

The state of the memory cell C11 that is read depends on the intensity of the current which flows in the channel CH2 of the select transistor ST of the cell C11. Here again, this current depends on the bias voltage of the source region n0, which depends on the distance between the memory cell read and the closest contact C5. This current variation may generate reading errors.

Figure 8:
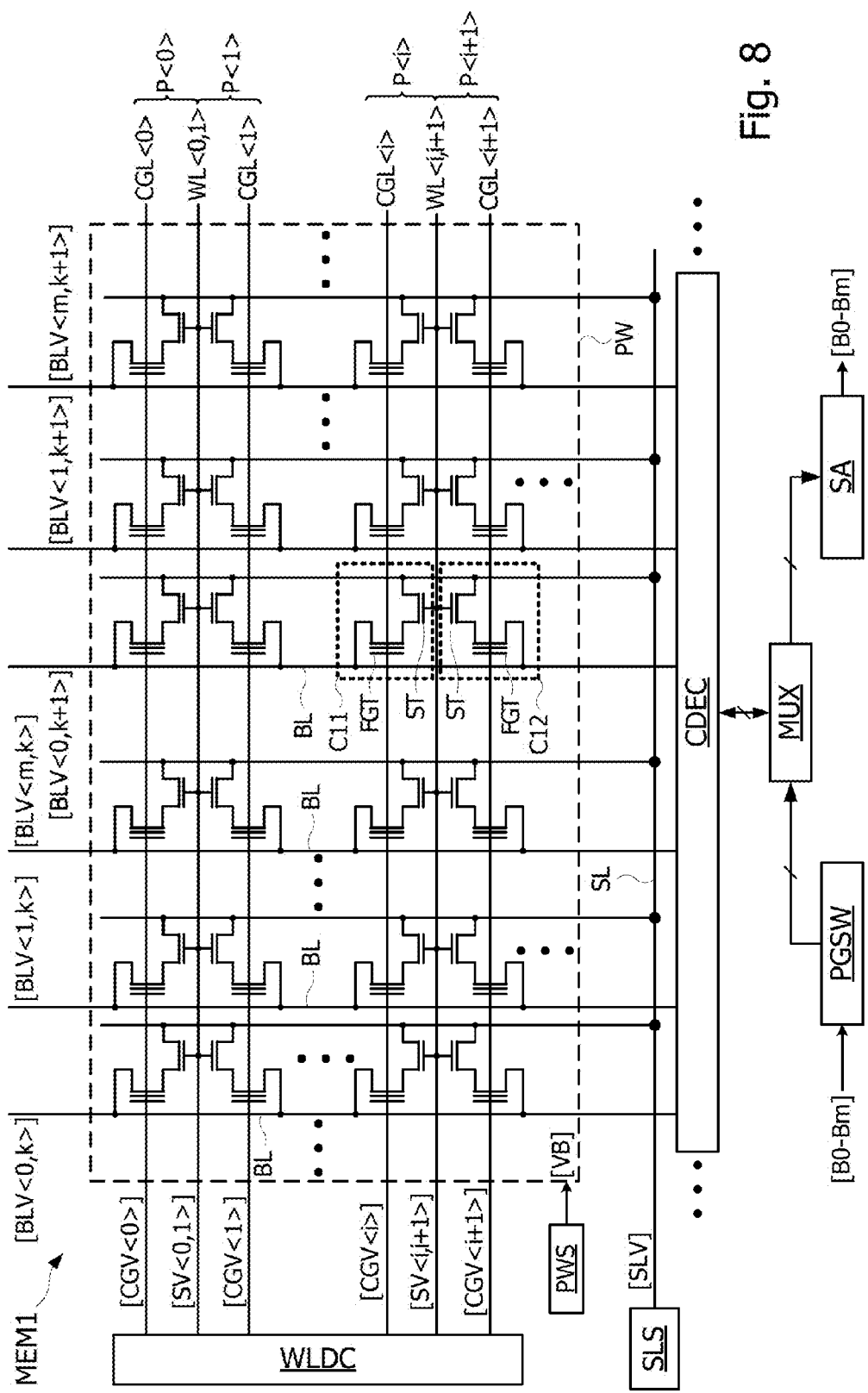

FIG. 8 represents a page-erasable memory comprising a memory array MEM1 made in a well PW. The memory array comprises M×N memory cells forming pairs of memory cells C11, C12, each memory cell C11, C12 comprising a charge accumulation transistor FGT in series with a select transistor ST. The select transistors ST of each pair share a common select gate SGC.

The memory array MEM1 comprises M pages P<i> each comprising a row of N memory cells, and a control gate line CGL<i>. FIG. 8 shows two first pages P<0>, P<1> of ranks 0 and 1, and two pages P<i>, P<i+1> of ranks i and i+1. The memory also comprises N bit lines BL<j,k>, each being coupled to a memory cell of the same rank in each page. The bit lines BL<j,k> can be grouped together in word columns k of m+1 bit lines, j ranging between 0 and m. FIG. 8 shows the bit lines of two word columns k and k+1. Each bit line BL<j,k> is connected to the drain regions n1 of the floating-gate transistors FGT of memory cells of the same rank j,k. Each control gate line CGL<i> is connected to the state control gates CG of the floating-gate transistors FGT of memory cells of the same rank i.

The memory array MEM1 also comprises control lines WL<i,i+1> for controlling the select transistors ST, which are connected to the common select gates SGC of the select transistors of the memory cells of two twin pages P<0>-P<1>, P<i>-P<i+1>. Thus, each control line WL<i,i+1> of rank i,i+1 is associated with the two twin pages P<i>,P<i+1> of ranks i and i+1 and controls the select transistors ST of the memory cells of these two twin pages.

The voltages applied to the various control lines BL<j,k>, CGL<i>, WL<i,i+1> of the memory array MEM1 are supplied by units of the memory according to an address of a page to be erased or a group of memory cells to be read or programmed. These units comprise:

a column decoder CDEC, which couples the multiplexer MUX to the different bit lines, selector switches PGSW which, during the programming of the memory cells, apply the appropriate voltages BLV<j,k> via the multiplexer MUX, to the different bit lines BL<j,k> connected to the memory cells of a word to be programmed B0-Bm, a word line driver circuit WLDC that applies to the different word lines WL<i,i+1> the voltages SV<i,i+1> intended for the common select gates SGC of the select transistors ST, and which applies to the different control gate lines CGL<i> the control gate voltages CGV<i> of the floating-gate transistors FGT, a source line switch SLS that applies the source line voltage SLV to the layer n0 forming a source plane, a well switch PWS that applies the substrate voltage VB to the well PW, sense amplifiers SA, which, during the reading of memory cells, apply the appropriate voltages BLV<j,k> to the different bit lines BL<j,k> via the multiplexer MUX, and supply the bits B0-Bm of a binary word read in the memory.

These units are configured to supply the voltages capable of performing programming, reading and erasing operations. In particular, during a programming operation, the word line driver circuit WLDC supplies the control gate line CGL connected to the memory cells of the pair of word lines WL<i,i+1> including the memory cells to be programmed with the programming voltage. During an erasing operation, the word line driver circuit WLDC can supply the control gate line connected to the memory cells of twin pages P<i>-P<i+1> with an erase voltage, causing all the memory cells of these two twin pages to be erased. During a reading operation, the sense amplifiers SA supply the bit lines BL of the memory cells to be read with a read bias voltage.

Figure 9:
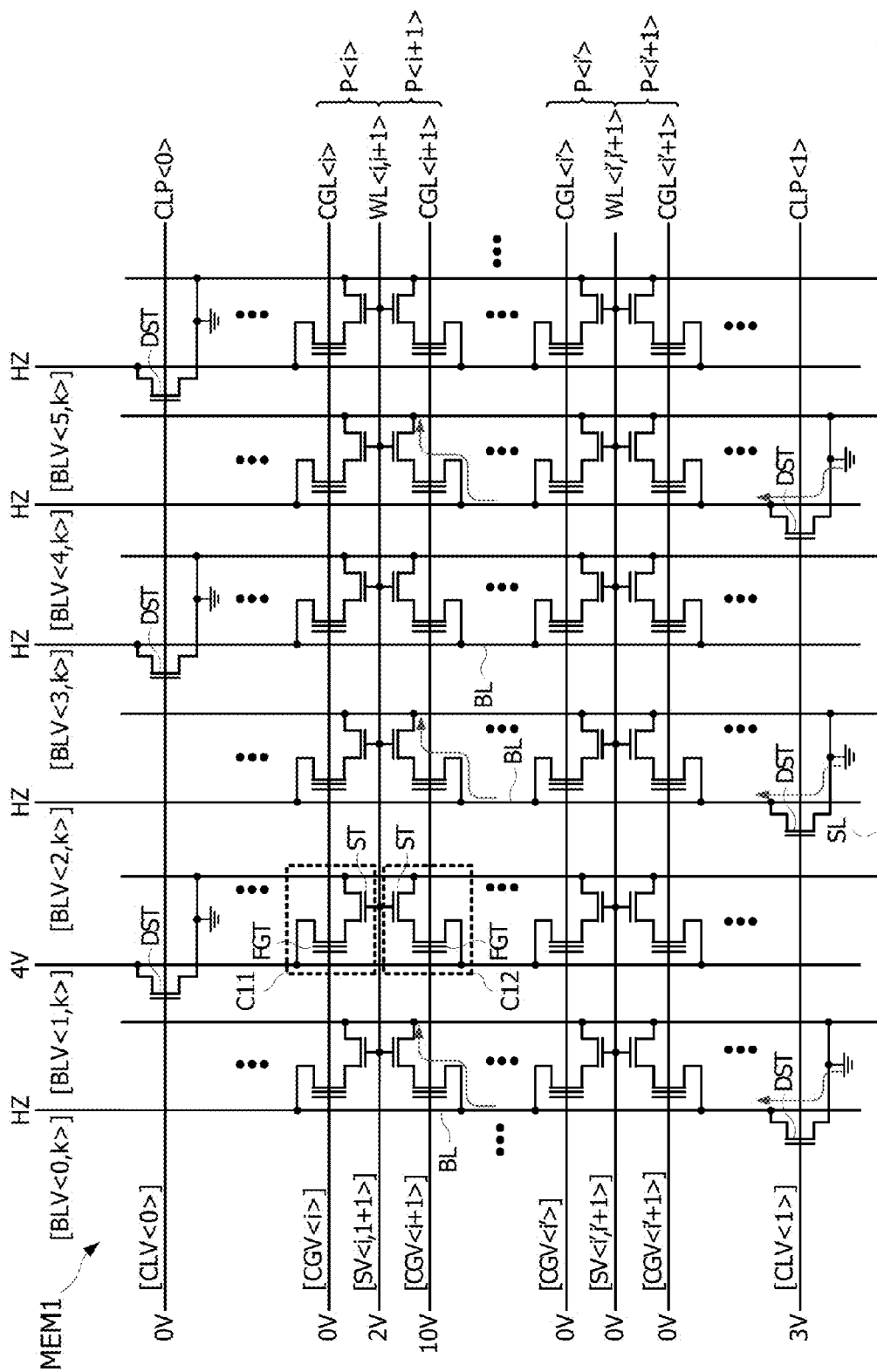

FIG. 9 represents the memory array formed in the well PW, during an operation of programming the memory cell C12. According to one embodiment, certain memory cells of the memory array are used to bias the layer n0. In the embodiment in FIG. 9, the bit lines BL are coupled to the ground through a bit line select transistor DST. According to one embodiment, the gates of the transistors DST are connected to bit line select lines CLP<0>, CLP<1>, the gates of the transistors DST of the bit lines of even rank being connected to the select line CLP<0> and the gates of the transistors DST of the bit lines of odd rank being connected to the select line CLP<1>. The select lines CLP<0> and CLP<1> can be controlled by the decoder WLDC simply according to the parity of the access address word for accessing the memory cells.

In the example in FIG. 9, the memory cell C12 is being programmed. For this purpose, the voltage BLV<1,k> of the odd bit line BL connected to the memory cell C12 is set to 4V. The other bit lines are subjected to a floating potential HZ. The voltage CGV<i+1> of the control gate line CGL<i+1> connected to the memory cell C12 is set to 10V. The voltage SV<i,i+1> of the word line WL<i,i+1> connected to the memory cell C12 is set to 2V. The other control gate lines CGL and the other word lines are grounded (0V). The result is that the memory cells connected to the control gate line CGL<i+1> are on. As the memory cell C12 is connected to a bit line of odd rank, the select line CLP<1> of the transistors DST connected to the bit lines BL of odd rank is put to a voltage CLV<1> sufficiently low (to the ground) to switch off these transistors, and the select line CLP<0> of the transistors DST connected to the bit lines BL of even rank is put to a positive voltage CLV<0>, for example between 3 and 5V to render these transistors on. The result is that the bit lines BL of even rank are grounded whereas the other bit lines remain at a floating potential. As a result, the memory cells connected to the control gate line CGL<i+1> and to the bit lines of even rank are on and thus ground the source plane n0 at points distanced from the edge of the well PW, and in particular near the memory cell to be programmed.

It will be understood that, when programming a memory cell connected to a bit line of even rank, the select line CLP<0> is put to a voltage sufficiently low (to the ground) to switch off the transistors DST connected to the bit lines of even rank and the select line CLP<1> is put to a positive voltage (for example between 3 and 5V) to switch on the transistors DST connected to the bit lines of odd rank.

If the programming operations are performed by word, they can be performed in two successive steps, one to program the memory cells connected to bit lines of even rank, and the other to program the memory cells connected to bit lines of odd rank. Another solution could involve using the word decoder to couple to the ground only bit lines not belonging to a word to be programmed, or all these bit lines.

Figure 10:
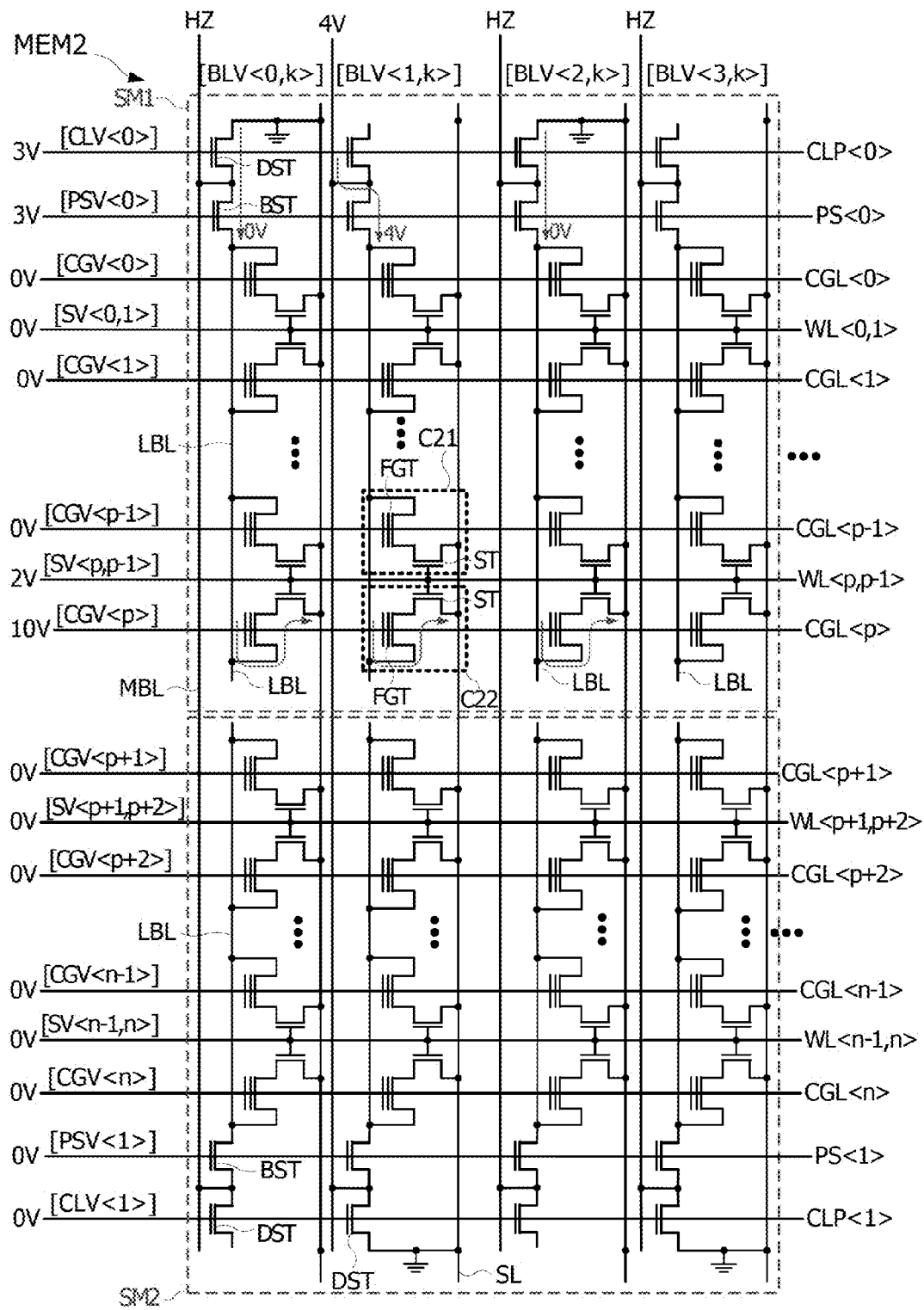
FIG. 10 represents circuits of a memory array, showing another method for biasing the deep layer, during the programming of memory cells, according to another embodiment.

FIG. 10 represents a memory array MEM2 formed in a well PW, during an operation of programming a memory cell C22 belonging to a pair of twin memory cells C21, C22. According to one embodiment, each bit line BL of the memory array is divided into several local bit lines LBL coupled to a main bit line MBL through a local bit line select transistor BST. In the example in FIG. 10, each bit line is divided into a first and a second local bit line LBL. Thus, this division of the local bit lines defines in the memory array two sectors of memory cells, i.e., a first sector SM1 of memory cells connected to the first local bit lines, and a second sector SM2 of memory cells connected to the second local bit lines. The memory array SM1 comprises the control gate lines CGL<0> to CGL<p> and the word lines WL<0,1> to WL<p-1,p>, and the memory array SM2 comprises the control gate lines CGL<p+1> to CGL<n> and the word lines WL<p+1,p+2> to WL<n-1,n>. The gates of the transistors BST connected to the first local bit lines are connected to a sector select line PS<0>, and the gates of the transistors BST connected to the second local bit lines are connected to a sector select line PS<1>.

Furthermore, according to one embodiment, each main bit line MBL is connected to the ground through a select transistor DST. In the example in FIG. 10, this connection to the ground is performed through operations of connecting bias contacts for biasing the layer n0 to the ground. The gates of the transistors DST are connected to bit line select lines CLP<0>, CLP<1>, the gates of the transistors DST of the main bit lines MBL of even rank being connected to the select line CLP<0>, and the gates of the transistors DST of the main bit lines MBL of odd rank being connected to the select line CLP<1>. The select lines CLP<0> and CLP<1> can be controlled by the decoder WLDC according to the parity of the access address word for accessing the memory cells. In the example in FIG. 10, the memory cell C22 is being programmed. For this purpose, the voltage BLV<1,k> of the main bit line MBL of odd rank connected to a memory cell C22 is set to 4V. The other main bit lines MBL are subjected to a floating potential HZ. The voltage PSV<0> of the select line PS<0> of the first sector SM1 to which the memory cell C22 belongs is set to a positive voltage (for example between 3 and 5V) to render the transistors BST of the first sector SM1 on. The select line PS<1> of the second sector SM2 is set to a sufficiently low voltage (to the ground) to switch off the transistors BST of the second sector SM2. The voltage CGV<p> of the control gate line CGL<p> connected to the memory cell C22 is set to 10V. The voltage SV<p−1,p> of the word line WL<p−1,p> connected to the memory cell C22 is set to 2V. The other control gate lines CGL and the other word lines WL are grounded (0V). The result is that all the memory cells connected to the control gate line CGL<p> are on. The select line CLP<1> of the transistors DST connected to the main bit lines MBL of odd rank is put to a sufficiently low voltage (to the ground), so that these transistors are off. The select line CLP<0> of the transistors DST connected to the main bit lines MBL of even rank is put to a positive voltage, for example between 3 and 5V, so that these transistors are on. The result is that the main bit lines MBL of even rank are grounded whereas the other bit lines remain at a floating potential. As a result, the memory cells of the first sector SM1 connected to the control gate line CGL<p> and coupled to the main bit lines MBL of even rank are on and thus ground the source plane n0 at points distanced from the edge of the well PW.

It shall be noted that the transistor DST of the main bit line MBL to which the memory cell C22 is coupled is off, and thus the positive voltage BLV<1,k> (set to 4V) of this bit line is not short-circuited with the ground. It will be understood that, if the memory cell to be programmed is coupled to a main bit line of even rank, the main bit lines of odd rank are put to the ground by the transistors DST controlled by the line CLP<1>.

Figure 11:
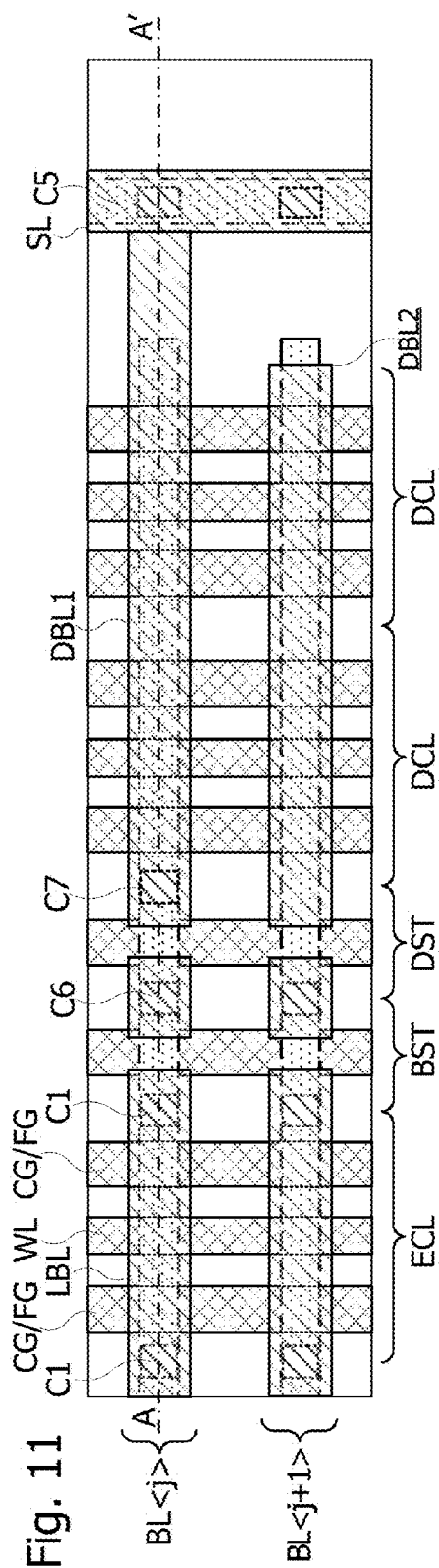
FIG. 11 represents a top view of a right end region of two bit lines of the memory array in FIG. 10.
Figure 12:
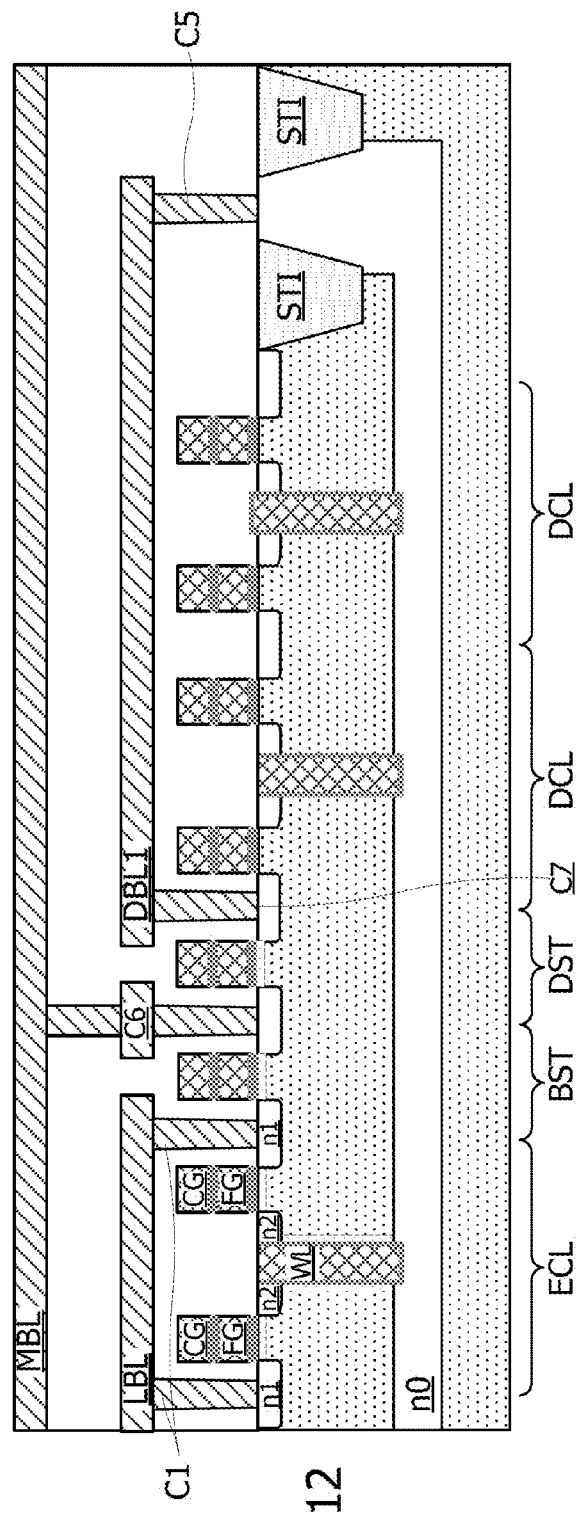
FIG. 12 is a schematic cross-section according to a plane AA' of the right end region of a bit line, represented in FIG. 11.
Figure 13:
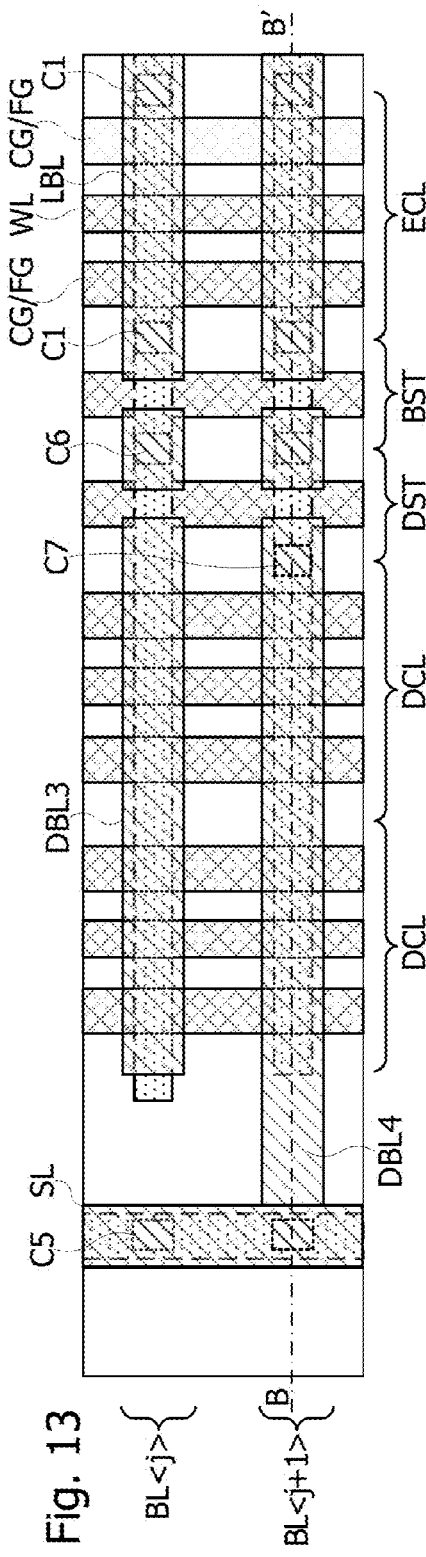
FIG. 13 represents a top view of a left end region of two bit lines of the memory array in FIG. 10.
Figure 14:
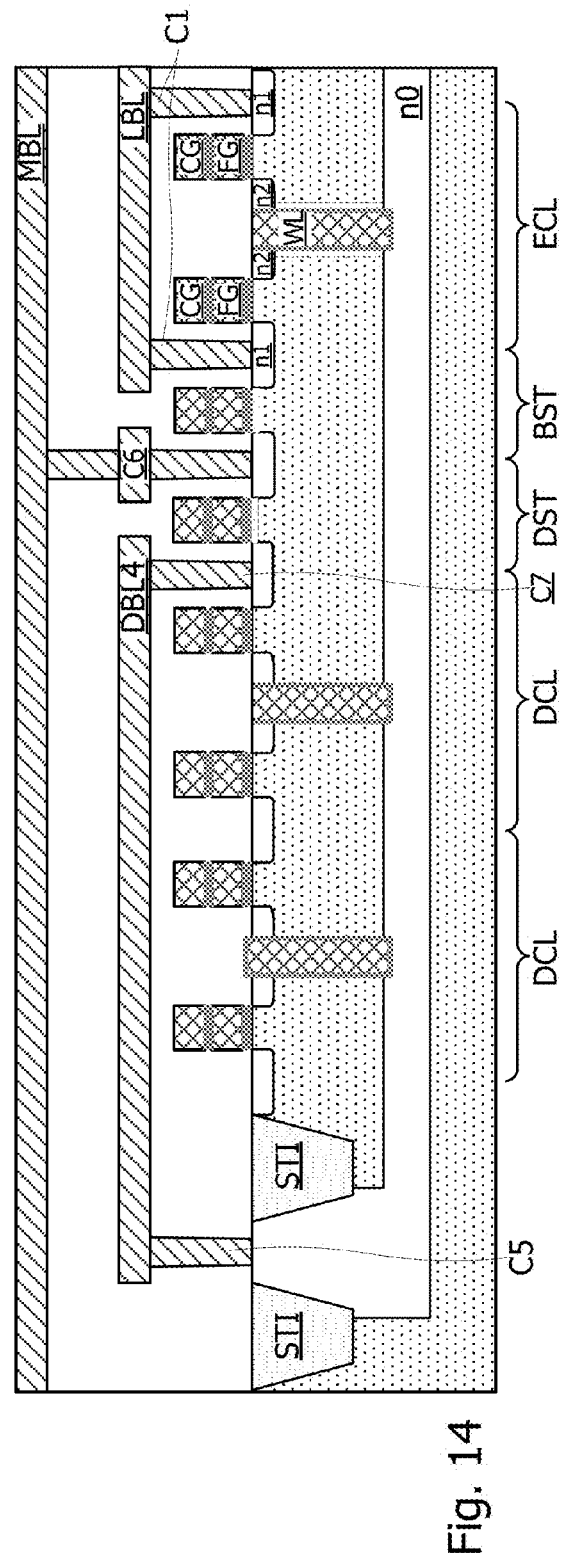
FIG. 14 is a schematic cross-section according to a plane BB' of the left end region of a bit line, represented in FIG. 13.

FIGS. 11 and 12 represent a right end region of bit line of the memory array in FIG. 10, and FIGS. 13 and 14, a corresponding left end region. FIGS. 11 and 13 in particular represent two rows of memory cells along two bit lines BL<j>, BL<j+1>. FIG. 12 represents the bit line BL<j>, and FIG. 14, the bit line BL<j+1>. For greater clarity, FIGS. 11 and 13 do not have any main bit line MBL.

Each end region of a bit line BL<j>, BL<j+1> comprises a first (FIG. 14) or a last (FIG. 12) pair of memory cells ECL (as represented in FIG. 2), coupled to a local bit line LBL, a local bit line select transistor BST coupling the local bit line LBL to a link C6 connected to a main bit line MBL, a select transistor DST, and a bit line end section DBL1, DBL2, DBL3, DBL4 uncoupled from a local bit line and beneath which pairs of memory cells DCL unused due to possible edge effects are formed. According to one embodiment, one DBL1, DBL4 of the two right and left bit line end sections of each bit line BL<j>, BL<j+1> is connected to the ground, on the right (FIG. 12 and row of memory cells located at the top on FIG. 11) for the main bit lines MBL of rank having a certain parity, and on the left (FIG. 14 and row of memory cells located at the bottom on FIG. 13) for the main bit lines MBL of rank having another parity. The bit line end sections DBL1, DBL4 are coupled to the main bit line MBL formed above, through a link C7 and one of the transistors DST connected to the link C6 and to the link C7.

In the example in FIGS. 11 to 14, the connection to the ground of the bit line end sections DBL1, DBL4 is done by extending the bit line end sections up to a bias contact C5 for biasing the deep layer n0. It shall be noted that in the example in FIGS. 12 and 14, the select transistors DST, BST have two superimposed gates, like the transistors FGT of the memory cells, for the sake of manufacturing simplicity. However, the transistors DST, BST are used like conventional select transistors, the lower gate corresponding to the floating gate being directly controlled. The select transistors DST, BST could be manufactured with a single gate like the select transistors ST.

Figure 15:
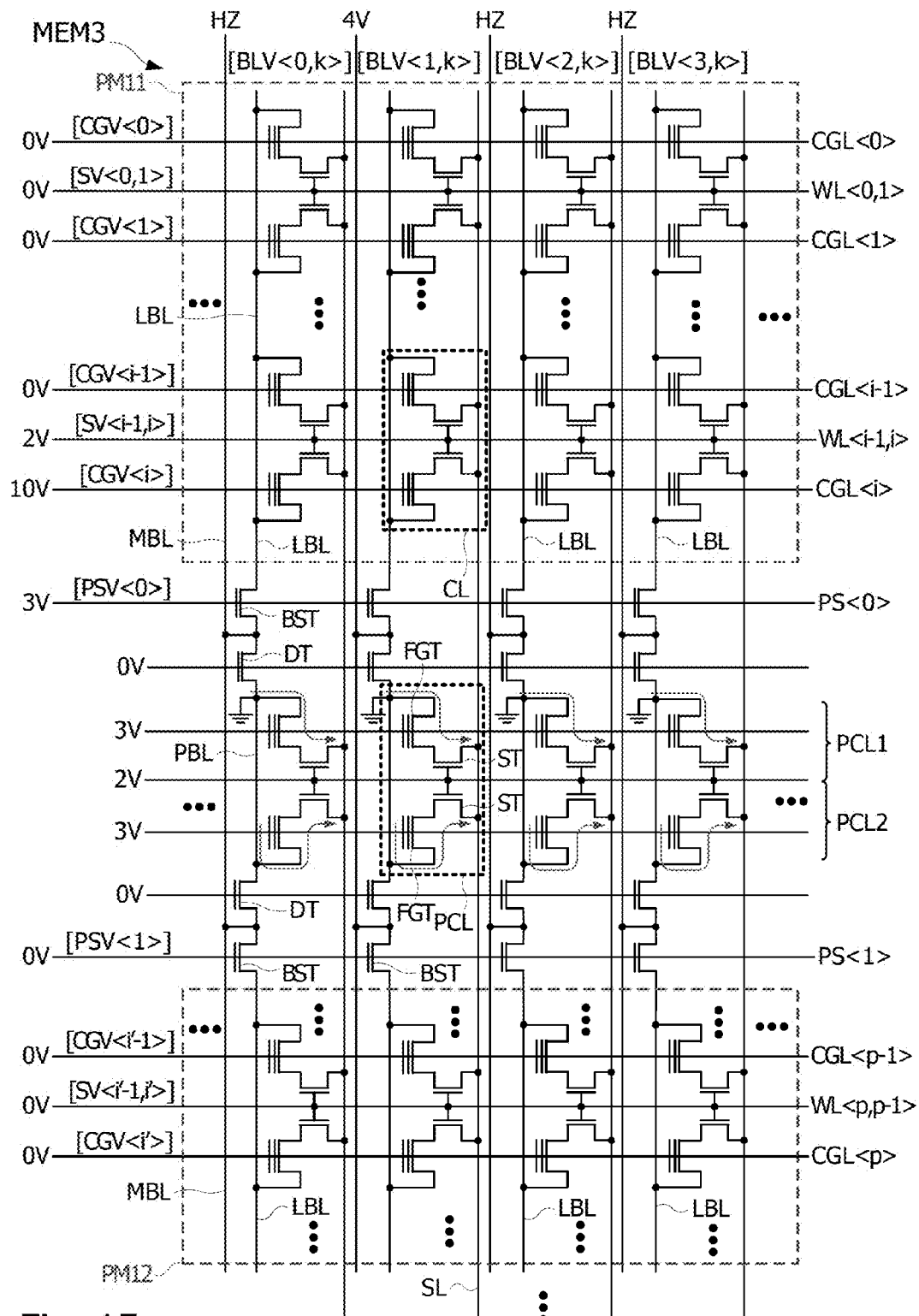
FIG. 15 represents circuits of a memory array, showing a method for biasing the deep layer, according to another embodiment.

FIG. 15 represents a memory array MEM3 formed in a well PW, according to another embodiment. FIG. 15 indicates voltages supplied to the memory array during an operation of programming a memory cell of a pair of twin memory cells CL. Here again, each bit line BL of the memory array is divided into several local bit lines LBL coupled to a main bit line MBL through a local bit line select transistor BST. Thus, this division of the local bit lines defines in the memory array several sectors PM11, PM12 of memory cells, each grouping together memory cells connected to local bit lines of the same rank, i.e., connected to the same word lines WL<i,i+1>. The gates of the transistors BST connected to the local bit lines LBL of the sector PM11 are connected to a sector select line PS<0>, and the gates of the transistors BST connected to the local bit lines LBL of the sector PM12 are connected to a sector select line PS<1>.

According to one embodiment, the memory array MEM3 comprises a row PCL1, PCL2 of memory cells, or of pairs of dedicated twin memory cells PCL, which are used to couple the source plane n0 to the ground. For this purpose, the memory cells of the rows PCL1, PCL2 are biased so as to be on and the drain terminals of the floating-gate transistors FGT of the memory cells of each row PCL1, PCL2 are coupled to the ground, directly or through a bit line section PBL. The gates of the transistors FGT of each row PCL1, PCL2 receive a positive voltage, for example between 3 and 5V, and the gates of the select transistors ST of each row PCL1, PCL2 receive a positive voltage for example set to 2V. The rows PCL1, PCL2 can be formed between the sectors PM11, PM12, as shown in FIG. 15.

Figure 16:
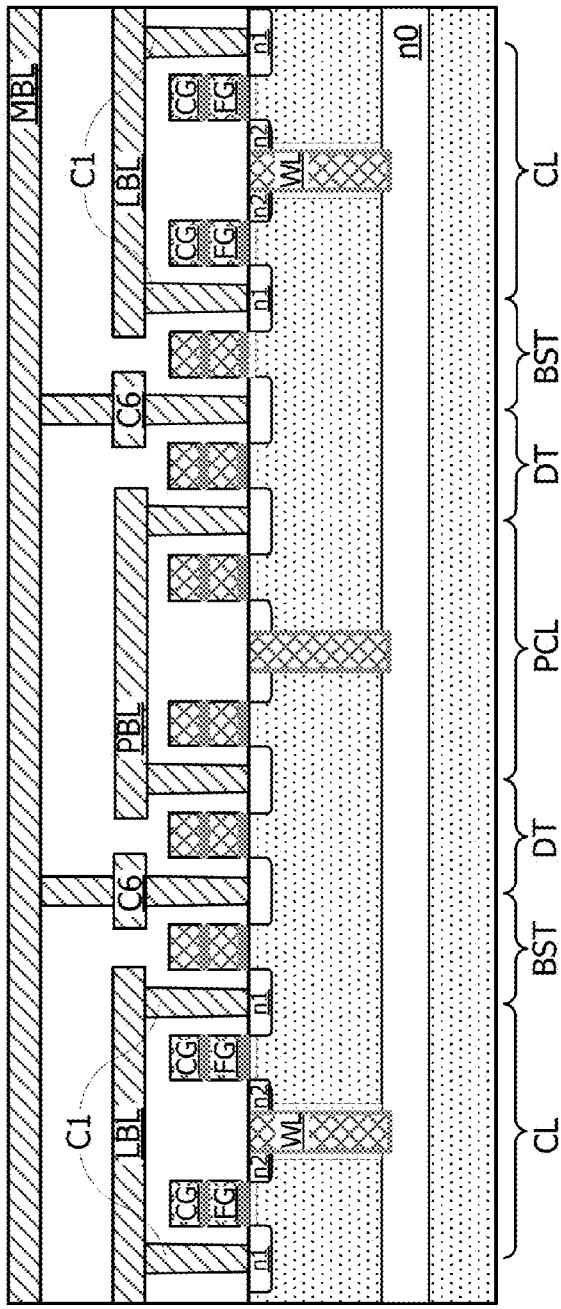
FIG. 16 is a schematic cross-section of a bit line region of the memory array in FIG. 15.
Figure 17:
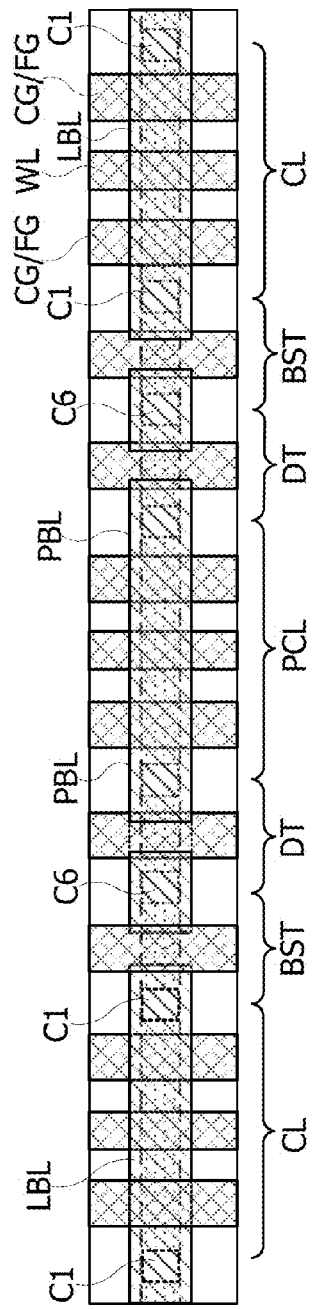
FIG. 17 represents a top view of a bit line region of the memory array in FIG. 15.

FIGS. 16 and 17 represent a bit line region of the memory array MEM3 in FIG. 15, and in particular, a pair of twin memory cells CL of each sector PM11, PM12 and a pair of memory cells PCL of the rows PCL1, PCL2, between the two sectors PM11, PM12. The region between the two sectors PM11, PM12 comprises two select transistors BST for selecting a local bit line LBL coupling the main bit line MBL to a respective local bit line LBL of the sectors PM11, PM12, and between the transistors BST two unused transistors DT, and the pair of twin memory cells PCL disposed between the transistors DT.

In the example of FIGS. 16 and 17, the select transistors DST, BST have two superimposed gates, like the transistors FGT of the memory cells, for the sake of manufacturing simplicity. However, the transistors DST, BST are also used like conventional select transistors, the lower gate corresponding to the floating gate being directly controlled. The select transistors DST, BST could be manufactured with a single gate like the select transistors ST. Similarly, the double-gate transistors of the pairs of cells PCL (FIGS. 15, 16 and 17) could also be manufactured with a single gate and are used as select transistors. For this purpose, the voltage at 3V on FIG. 15 is directly supplied to the lower gate.

It will be understood by those skilled in the art that the present disclosure is susceptible of various alternative embodiments and various applications. In particular, the present disclosure also covers combinations of the embodiments described above. Thus, in the embodiments described with reference to FIGS. 8 to 14, provision may be made for memory cells dedicated to biasing or grounding the source plane n0.

Furthermore, the present disclosure may also apply to a memory in which the programming operations are performed by Fowler-Nordheim effect.

Furthermore, it goes without saying that the voltages indicated in FIGS. 6, 7, 9, 10 and 15 are only provided as an example, and that other voltages may be supplied to the different memories described above, these voltages depending in particular on the nature of the substrate and the different doped regions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
controlling a non-volatile memory on a semiconductor substrate, the memory including:
bit lines,
control gate lines,
a source line formed deep down in the substrate, and
pairs of twin memory cells, each including a first memory cell that includes a first floating-gate transistor having a control gate coupled to a first one of the control gate lines, a first conduction terminal coupled to a first one of the bit lines and a second conduction terminal coupled to the source line through a first select transistor having an embedded vertical select control gate, coupled to a word line, and a second memory cell that includes a second floating-gate transistor having a control gate coupled to a second one of the control gate lines, a first conduction terminal coupled to the first bit line and a second conduction terminal coupled to the source line through a second select transistor sharing with the first select transistor the select control gate, wherein the controlling includes:
turning on a first selected memory cell of one of the pairs of memory cells, thereby electrically coupling the source line to a line coupled to ground,
programming or reading a second selected memory cell of the pairs of memory cells while the first selected memory cell electrically couples the source line to the line coupled to ground.

2. The method according to claim 1, wherein the programming or reading includes programming the second selected memory cell by hot-electron injection by passing a programming current through the second selected memory cell, wherein passing the programming current includes applying a first positive voltage to the bit line coupled to the second selected memory cell and a second positive voltage to the control gate line coupled to the second selected.

3. The method according to claim 1, wherein the programming or reading includes reading the second selected memory cell, the reading including:
applying a positive read voltage to the control gate line coupled to the second selected memory cell, and
applying a zero voltage to the control gate line coupled to the other twin memory cell of the pair of twin memory cells that includes the second selected memory cell.

4. The method according to claim 1, wherein the first selected memory cell is dedicated to grounding the source line, the first selected memory cell being kept on, and the first conduction terminal of the floating-gate transistor of the dedicated memory cell being coupled to the ground.

5. The method according to claim 1, wherein the first and second selected memory cells are coupled to a same word line, to a same control gate line of the control gate lines, and to respective bit lines having respective ranks of different parities among the bit lines of the memory.

6. A non-volatile memory on a semiconductor substrate, comprising:
bit lines,
control gate lines,
a word line,
a source line formed deep down in the substrate, and
pairs of twin memory cells, each pair including:
a first memory cell that includes:
a first floating-gate transistor having a control gate coupled to a first one of the control gate lines, a first conduction terminal coupled to a first one of the bit lines, and a second conduction terminal, and
a first select transistor coupling the second conduction terminal to the source line and having a select control gate coupled to the word line,
a second memory cell that includes:
a second floating-gate transistor having a control gate coupled to a second one of the control gate lines, a first conduction terminal coupled to the first bit line, and a second conduction terminal, and
a second select transistor coupling the second conduction terminal of the second floating-gate transistor to the source line and sharing with the first select transistor the select control gate, and
a read/write circuit configured to program the first memory cell independently of the second memory cell and vice versa, and turn on a first selected memory cell of one of the pairs of twin memory cells, thereby causing the first selected memory cell to couple the source line to a line coupled to ground, during at least one of programming and reading a second selected memory cell of the pairs of memory cells.

7. The memory according to claim 6, wherein the read/write circuit is configured to program the second selected memory cell by hot-electron injection, by passing a programming current through the second selected memory cell, by applying a first positive voltage to the bit line coupled to the memory cell to be programmed and a second positive voltage to the control gate line coupled to the memory cell to be programmed.

8. The memory according to claim 6, wherein the read/write circuit is configured to read the second selected memory cell:
by applying a positive read voltage to the control gate line coupled to the second selected memory cell, and
by applying a zero voltage to the control gate line coupled to the other twin memory cell of the pair of twin memory cells that includes the second selected memory cell.

9. The memory according to claim 6, wherein the first selected memory cell is dedicated to grounding the source line, the first selected memory cell being kept on, and the first conduction terminal of the floating-gate transistor of the first selected memory cell being coupled to the ground.

10. The memory according to claim 6, wherein the bit lines include even bit lines and odd bit lines and the control gate lines include third and fourth control gate lines, the memory comprising:
first grounding transistors configured to respectively couple the even bit lines to the ground under control by the third control gate line; and
second grounding transistors configured to respectively couple the odd bit lines to the ground under control by the fourth control gate line.

11. The memory according to claim 10, wherein the even bit lines include respective even bit line end sections respectively coupled to the first grounding transistors and the odd bit lines include respective odd bit line end sections respectively coupled to the second grounding transistors, the memory comprising a plurality of bias contacts connected to the source line and connected to alternating ones of the bit lines.

12. The memory according to claim 6, wherein the bits lines include main bit lines and local bit lines, the memory comprising:
    memory array sectors, each sector including plural of the local bit lines, and
    a plurality of local bit line select transistors respectively coupling the local bit lines to one of the main bit lines, the control gate lines including a plurality of sector control gate lines each configured to control the local bit line select transistors of a respective one of the memory array sectors.

13. The memory according to claim 6, wherein each select control gate has two opposite faces along which extend a first vertical channel region for the first select transistor, and a second vertical channel region for the second select transistor.

14. A memory according to claim 6, wherein each pair of twin memory cells comprises:
    a first doped region extending along a first upper edge of the select control gate which is embedded in the substrate, the first doped region being a drain region of the select transistor and a source region of the floating-gate transistor, of the first memory cell of the pair of twin memory cells,
    a second doped region extending along a second upper edge of the select control gate opposite the first upper edge, the second doped region being a drain region of the select transistor and a source region of the floating-gate transistor, of the second memory cell of the pair of twin memory cells, and
    a third doped region extending deep down in the substrate, in contact with two opposite lower edges of the embedded gate, and the third doped region being the source line, wherein:
    the first select transistor of the pair of twin memory cells has a first vertical channel region extending on a first side of the select control gate, between the first doped region and the third doped region; and
    the second select transistor of the pair of twin memory cells has a second vertical channel region extending on a second side of the select control gate, between the second doped region and the third doped region.

* * * * *